US009795032B2

(12) United States Patent
Koike et al.

(10) Patent No.: US 9,795,032 B2
(45) Date of Patent: Oct. 17, 2017

(54) ELECTRONIC COMPONENT AND METHOD FOR MANUFACTURING SAME

(71) Applicant: Material Concept, Inc., Sendai-shi, Miyagi (JP)

(72) Inventors: Junichi Koike, Sendai (JP); Daisuke Ando, Sendai (JP); Yuji Sutou, Sendai (JP)

(73) Assignee: MATERIAL CONCEPT, INC., Miyagi (JP)

( * ) Notice: Subject to any disclaimer, the term of this patent is extended or adjusted under 35 U.S.C. 154(b) by 0 days.

(21) Appl. No.: 15/325,289

(22) PCT Filed: Jul. 10, 2015

(86) PCT No.: PCT/JP2015/069920
§ 371 (c)(1),
(2) Date: Jan. 10, 2017

(87) PCT Pub. No.: WO2016/009963
PCT Pub. Date: Jan. 21, 2016

(65) Prior Publication Data
US 2017/0181279 A1 Jun. 22, 2017

(30) Foreign Application Priority Data
Jul. 15, 2014 (JP) .................................. 2014-145342

(51) Int. Cl.
*B32B 15/04* (2006.01)
*H05K 1/09* (2006.01)
(Continued)

(52) U.S. Cl.
CPC ............. *H05K 1/09* (2013.01); *H05K 1/0306* (2013.01); *H05K 1/11* (2013.01); *H05K 3/10* (2013.01); *H05K 3/389* (2013.01)

(58) Field of Classification Search
USPC ........................................ 428/457, 469, 688
See application file for complete search history.

(56) References Cited

U.S. PATENT DOCUMENTS

| 8,318,292 B2 | 11/2012 | Ohigashi |
| 2008/0170193 A1* | 7/2008 | Koike ............... G02F 1/136286 349/138 |

(Continued)

FOREIGN PATENT DOCUMENTS

| JP | 08045339 A | 2/1996 |
| JP | 2007031741 A | 2/2007 |

(Continued)

OTHER PUBLICATIONS

Office Action for Taiwanese Patent Application No. 104122971; Dated Dec. 27, 2016.

(Continued)

*Primary Examiner* — Lauren R Colgan
(74) *Attorney, Agent, or Firm* — Cantor Colburn LLP

(57) ABSTRACT

To provide: an electronic component which comprises a copper electrode on an inorganic material substrate and wherein the adhesion strength between the substrate and the copper electrode is high, thereby achieving improved adhesion of the copper electrode; and a method for manufacturing this electronic component. An electronic component which comprises a copper electrode on an inorganic material substrate and wherein an interface layer containing copper, manganese, silicon and oxygen is provided at the interface between the substrate and the copper electrode, and the interface layer contains crystal grains that are mainly formed of copper and dispersed in the interface layer. A method for manufacturing this electronic component comprises: an interface layer formation step for forming an interface layer (Continued)

on the substrate; and an electrode formation step for forming the copper electrode on the interface layer.

17 Claims, 4 Drawing Sheets

(51) Int. Cl.
*H05K 3/38* (2006.01)
*H05K 1/03* (2006.01)
*H05K 3/10* (2006.01)
*H05K 1/11* (2006.01)

(56) References Cited

U.S. PATENT DOCUMENTS

| | | | | |
|---|---|---|---|---|
| 2010/0009530 A1* | 1/2010 | Haneda | ............... | H01L 21/2855 438/627 |
| 2010/0013096 A1* | 1/2010 | Irumata | ............... | C23C 14/3414 257/741 |
| 2010/0045887 A1* | 2/2010 | Koike | ................... | G02F 1/1368 349/43 |
| 2010/0096755 A1* | 4/2010 | Tatsumi | ............ | H01L 21/76841 257/751 |
| 2010/0140802 A1 | 6/2010 | Matsumoto et al. | | |
| 2011/0014453 A1 | 1/2011 | Ohigashi | | |
| 2011/0032467 A1* | 2/2011 | Koike | ................. | C03C 17/3649 349/139 |
| 2011/0193088 A1* | 8/2011 | Mori | ................. | H01L 29/66765 257/57 |
| 2013/0122323 A1* | 5/2013 | Miki | ........................ | C22C 9/00 428/632 |

FOREIGN PATENT DOCUMENTS

| | | |
|---|---|---|
| JP | 2007046143 A | 2/2007 |
| JP | 2009010089 A | 1/2009 |
| JP | 2010103324 A | 5/2010 |
| JP | 2010272726 A | 12/2010 |
| JP | 2010278048 A | 12/2010 |
| JP | 2011061187 A | 3/2011 |
| JP | 2011104815 A | 6/2011 |
| JP | 5374779 A | 10/2013 |
| TW | 201004500 A | 1/2010 |

OTHER PUBLICATIONS

International Search Report corresponding to Application No. PCT/JP2015/069920; Date of Mailing: Oct. 6, 2015, with English translation.
Extended European Search Report corresponding to Application No. 15821293.6-1808/3166372 PCT/JP2015069920; dated Jul. 4, 2017.

* cited by examiner

ELECTRONIC COMPONENT AND METHOD FOR MANUFACTURING SAME

This is the U.S. national stage of application No. PCT/JP2015/069920, filed on Jul. 10, 2015. Priority under 35 U.S.C. §119(a) and 35 U.S.C. §365(b) is claimed from Japanese Application No. 2014-145342, filed Jul. 15, 2014, the disclosure of which is also incorporated herein by reference.

TECHNICAL FIELD

The present invention relates to an electronic component comprising copper electrodes on an inorganic material substrate and a method for manufacturing the same.

BACKGROUND ART

An electronic component is manufactured using a substrate made of an inorganic material in order to guarantee the dynamic durability and electrical insulation property. Typical examples of inorganic material substrates that are used include substrates of oxides such as silicate glass, alumina, and quartz, substrates of nitrides such as silicon nitride, and aluminium nitride, substrates of carbides such as silicon carbide and titanium carbide, and silicon substrates. Conductive electrodes (wiring) should be formed on a substrate in order to produce an electronic component using such a substrate or mounting a semiconductor, a capacitor, a resistor, and the like on the substrate.

Conductive materials such as silver and copper are used for such conductive electrodes. Silver is excellent in conductivity and oxidation resistance, however, it is expensive and also has disadvantages such that silver atom migration failure easily takes place. In contrast, copper has a material cost lower than that of silver, is excellent in migration resistance, and has electric resistivity equivalent to that of silver, so that the use of copper for a conductive electrode is desired.

Conventionally, methods known for forming copper electrodes on inorganic material substrates such as glass substrates are an electroless plating method and a method that involves applying a copper paste produced by mixing with a copper powder and baking. However, these methods are problematic in that the adhesion of copper to an inorganic material substrate is insufficient so that copper electrodes formed on an inorganic material substrate are easily peeled off.

To overcome such a problem concerning adhesion, for example, the formation of an electroless copper plated film, followed by application of plus potential and heating of the substrate simultaneously (Patent document 1), and the use of a copper paste composition prepared by mixing a copper powder, a copper oxide powder, a Pd compound, and a glass frit (Patent document 2) have been proposed.

Moreover, the formation of an interface layer between an inorganic material substrate and a copper electrode has also been proposed. For example, patent document 3 proposes to form a base film comprising a copper alloy film that contains oxygen, Mn, and Ag, patent document 4 proposes to form a zone where components of Cu, Ca, oxygen and Si are aggregated between a silicon oxide film and a copper film, and patent document 5 proposes the presence of a metal oxide containing at least one type of a cuprous oxide, a nickel oxide and a cobalt oxide in the contact interface between an insulating resin substrate and a metal thin film layer.

Patent Document 1: Japanese Unexamined Patent Application, Publication No. 2007-31741
Patent Document 2: Japanese Unexamined Patent Application, Publication No. H08-45339
Patent Document 3: Japanese Unexamined Patent Application, Publication No. 2009-10089
Patent Document 4: Japanese Unexamined Patent Application, Publication No. 2010-103324
Patent Document 5: Japanese Unexamined Patent Application, Publication No. 2011-104815

DISCLOSURE OF THE INVENTION

Problems to be Solved by the Invention

However, the method of patent document 1 requires a post-plating process. The paste composition of patent document 2 requires a plurality of copper raw materials and an expensive Pd component, resulting in a high manufacturing cost. The methods proposed in patent documents 3 to 5 are unable to sufficiently ensure dynamic durability (adhesion) of electronic components, for which more strict environmental control is required. Therefore, an interface layer that improves adhesion more significantly between an inorganic material substrate and a copper electrode has been desired.

The present invention has been achieved in view of these problems and an object of the present invention is to provide an electronic component comprising a copper electrode on an inorganic material substrate, wherein the adhesion strength between the substrate and the copper electrode is high to improve the adhesion of the copper electrode, and a method for manufacturing the electronic component.

Means for Solving the Problems

The present inventors have discovered that adhesion between an inorganic material substrate and a copper electrode can be improved by forming an interface layer containing copper, manganese, silicon and oxygen in the interface between the substrate and the copper electrode, causing the interface layer to contain crystal grains mainly composed of copper and dispersed therein. Thus, the present inventors have completed the present invention. Specifically, the present invention provides the following (1) to (17) and the like.

(1) An electric component comprising a copper electrode on an inorganic material substrate, wherein an interface layer containing copper, manganese, silicon and oxygen is provided at the interface between the substrate and the copper electrode, and the interface layer contains crystal grains mainly composed of copper and dispersed therein.

(2) The electronic component according to (1) above, wherein the interface layer has an average concentration of at least manganese higher than that of copper in a first region on the copper electrode side from the center of the thickness of the interface layer.

(3) The electronic component according to (1) or (2) above, wherein the interface layer has an average concentration of copper higher than that of manganese and that of silicon in a second region on the substrate side from the center of the thickness of the interface layer.

(4) The electronic component according to any one of (1) to (3) above, wherein the first region comprises an oxide mainly composed of manganese, and the second region comprises an oxide mainly composed of manganese and silicon.

(5) The electronic component according to any one of (1) to (4) above, wherein the second region contains more crystal grains than those contained in the first region.

(6) The electronic component according to any one of (1) to (5) above, wherein the interface layer has a thickness of 5 nm or more and 150 nm or less.

(7) The electronic component according to any one of (1) to (6) above, wherein the copper electrode contains no lead glass component.

(8) A method for manufacturing an electronic component comprising a copper electrode on an inorganic material substrate, comprising an interface layer formation step for forming an interface layer on the substrate, and an electrode formation step for forming the copper electrode on the interface layer, wherein the interface layer contains copper, manganese, silicon and oxygen, and contains crystal grains mainly composed of copper and dispersed therein.

(9) The method for manufacturing an electronic component according to (8) above, wherein the interface layer formation step comprises applying an interface layer raw-material solution (excluding an interface layer raw-material solution containing a copper complex) containing a manganese complex and a silane coupling agent onto the substrate, and then performing heat treatment to form the interface layer.

(10) The method for manufacturing an electronic component according to (9) above, wherein a molar concentration ratio Mn/Si of the manganese complex to the silane coupling agent is 0.3 or more and 1.7 or less.

(11) The method for manufacturing an electronic component according to any one of (8) to (10) above, wherein the interface layer formation step comprises applying an interface layer raw-material solution onto the substrate, and then performing heat treatment in an atmosphere containing oxygen at a temperature of 400° C. or higher and 600° C. or lower to form the interface layer.

(12) The method for manufacturing an electronic component according to any one of (8) to (11) above, wherein the interface layer formation step comprises applying an interface layer raw-material solution onto the substrate, performing, in an atmosphere containing oxygen, a first heat treatment at a temperature of 150° C. or higher and 225° C. or lower and then a second heat treatment at a temperature of 400° C. or higher and 600° C. or lower to form the interface layer.

(13) The method for manufacturing an electronic component according to any one of (8) to (12) above, wherein the above electrode formation step comprises forming the above copper electrode using a copper paste that contains no glass frit.

(14) The method for manufacturing an electronic component according to any one of (8) to (13), wherein the above electrode formation step comprises a step of applying a copper paste onto the above interface layer, and then, a step of drying in an inert gas atmosphere, and then, a step of oxidative baking in an atmosphere containing oxygen, and then, a step of reducing in an atmosphere containing carbon monoxide, alcohol or hydrogen to form the copper electrode.

(15) The method for manufacturing an electronic component according to (14) above, wherein the temperature in the above step of drying in an inert gas atmosphere is 150° C. or higher and 250° C. or lower.

(16) The method for manufacturing an electronic component according to (14) or (15) above, wherein the temperature in the above step of oxidative baking in an atmosphere containing oxygen is 350° C. or higher and 600° C. or lower.

(17) The method for manufacturing an electronic component according to any one of (14) to (16) above, wherein the temperature in the above step of reducing in an atmosphere containing carbon monoxide, alcohol or hydrogen is 350° C. or higher and 600° C. or lower.

Effects of the Invention

According to the present invention, an electronic component comprising a copper electrode on an inorganic material substrate, and specifically comprising an interface layer containing copper, manganese, silicon and oxygen in the interface between the substrate and the copper electrode can be obtained, wherein the interface layer contains crystal grains mainly composed of copper and dispersed therein, resulting in improved adhesion between the substrate and the copper electrode. Furthermore, the electronic component can be efficiently manufactured inexpensively.

PREFERRED MODE FOR CARRYING OUT THE INVENTION

Figure 1:
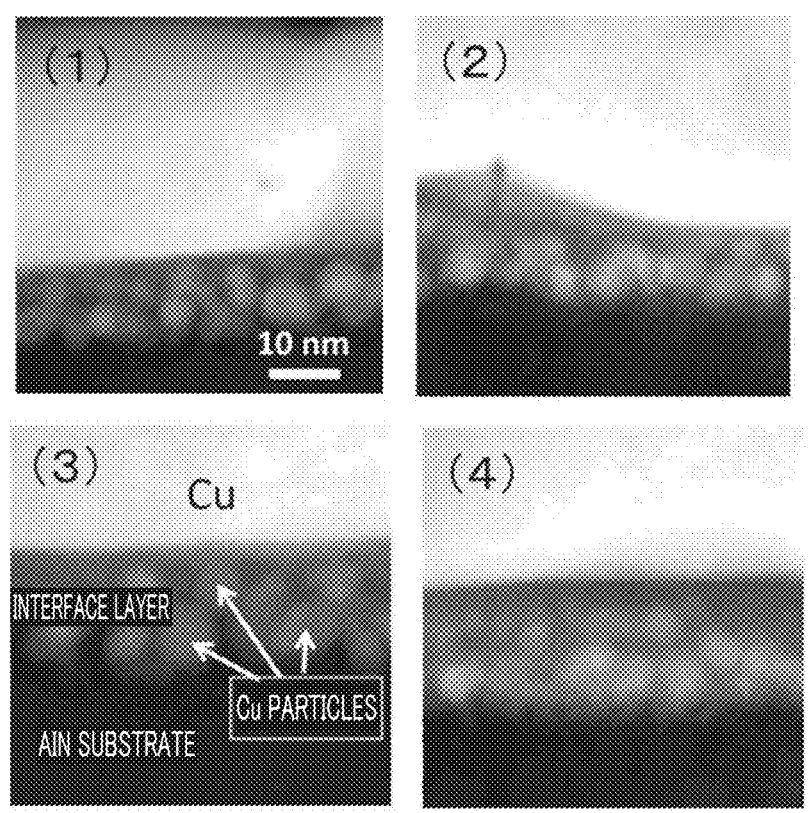
FIG. 1 shows the structures near the interface layers of Examples 1 to 4 of the present invention, as observed under a scanning electron microscope.

The embodiments of the present invention are as described below, but the present invention is not limited by these embodiments.

(Electronic Component)

The present invention is an electronic component comprising a copper electrode on an inorganic material substrate, wherein the copper electrode contains copper formed as wiring. Examples of such an electronic component include a chip resistor, a chip capacitor, and a solar cell. Further examples thereof include an electronic component that is wired to an electronically implemented product such as a printed circuit board and a substrate for which a through hole has been formed, and an electronic component that is connected to a transistor or the like for controlling pixel switching for a display.

(Inorganic Material Substrate)

The electronic component of the present invention comprises a substrate made of an inorganic material. Examples of the substrate that can be used herein include substrates of oxides such as silicate glass, alumina, and quartz, substrates of nitrides such as silicon nitride and aluminium nitride, substrates of carbides such as silicon carbide and titanium carbide, and a silicon substrate.

(Interface Layer)

The electronic component of the present invention comprises an interface layer containing copper, manganese, silicon and oxygen in the interface between an inorganic material substrate and a copper electrode, wherein the interface layer contains crystal grains mainly composed of copper and dispersed therein. The interface layer contains copper, so as to have improved adhesion with the copper electrode. The interface layer also contains silicon and oxygen, so as to have improved adhesion with the inorganic material substrate. Since the interface layer contains manganese, a spinel-structure intermediate phase of a copper manganese oxide and a manganese silicon oxide are formed, and the interface layer can be strengthened. Moreover, the above crystal grains existing dispersed within the interface layer are partially engaged in the substrate to play the role of an anchor, so as to further improve adhesion.

According to the concentration distribution of the components of the interface layer in the present invention, a transitional region is present on the copper electrode side, where the concentration of copper and the concentration of oxygen are the same, and, a transitional region is present on the inorganic material substrate, where the concentration of silicon and the concentration of copper are the same. Hence, in the present invention, such a region where the concentration of copper and the concentration of oxygen are the same on the copper electrode side of the interface layer is referred to as "copper electrode-side boundary" and such a region where the concentration of silicon and the concentration of copper are the same on the substrate side of the interface layer is referred to as "substrate-side boundary". Accordingly, a portion sandwiched between the two boundaries corresponds to the interface layer of the present invention.

In the present invention, an average concentration of at least manganese is preferably higher than that of copper in the first region on the copper electrode side from the center of the thickness of the interface layer, and the average concentration of manganese is preferably 1.3 or more times the average concentration of copper. With such a concentration distribution, a spinel-structure intermediate phase of a copper manganese oxide can be formed in the interface layer, so that the interface layer on the copper electrode side can be strengthened.

In the present invention, an average concentration of copper is preferably higher than that of manganese and that of silicon in the second region on the substrate side from the center of the thickness of the interface layer, and the average concentration of copper is preferably 1.4 or more times the average concentration of manganese and is preferably 1.2 or more times that of silicon. Such a concentration distribution facilitates the precipitation and dispersion of crystal grains mainly composed of silicon and copper, contributing to improvement in adhesion between the substrate and the copper electrode.

In the present invention, an oxide mainly composed of manganese is preferably formed in the first region on the copper electrode side, and an oxide mainly composed of manganese and silicon is preferably formed in the second region on the substrate side. The oxide mainly composed of manganese is excellent in adhesion with copper, and the oxide mainly composed of manganese and silicon is excellent in adhesion with the inorganic material substrate. Therefore, adhesion between the inorganic material substrate and the copper electrode can be more improved.

In the present invention, the above crystal grains are preferably present in the second region on the substrate side to an extent higher than that in the first region on the copper electrode side. This means that the amount of crystal grains existing in each region is high. Specifically, the density (area ratio) of the crystal grains existing in the second region is preferably 1.2 times or more the density (area ratio) in the first region. The crystal grains are partially engaged in the substrate to play the role of an anchor, so as to improve the adhesion. Accordingly, the crystal grains are preferably present in the second region on the substrate side to an extent higher than that in the other region.

In the present invention, the interface layer has a thickness of preferably 5 nm or more and 150 nm or less. The thickness of 5 nm or more tends to cause improved adhesion due to the interface layer. The thickness of 150 nm or less tends to be able to maintain the adhesion strength per area of 4 mm2 of the interface at 10 N or more.

(Copper Electrode)

The copper electrode in the present invention is an electrode mainly composed of copper and examples thereof include electrodes formed as wiring. A copper electrode wherein the copper content is almost 100% is preferred, however, the copper electrode can contain an impurity to an extent such that necessary conductivity is not deteriorated. The copper electrode can also contain a glass component in view of strengthening the adhesion. At this time, a lead glass component is softened at near 500° C., and tends to react with and be firmly bonded to an inorganic material substrate, so that in a cooling process following the formation of a copper electrode by heat treatment, the substrate becomes easily fractured when thermal deformation is applied to the substrate. Therefore, the copper electrode preferably contains no lead glass component.

(Manufacturing Method)

The method for manufacturing an electronic component of the present invention comprises an interface layer formation step for forming an interface layer on an inorganic material substrate, and an electrode formation step for forming copper electrodes on the interface layer, whereby as the interface layer, a structure containing copper, manganese, silicon and oxygen, in which crystal grains mainly composed of copper are dispersed therein, is formed.

(Interface Layer Formation Step)

In the interface layer formation step of the present invention, an interface layer raw-material solution containing a manganese complex and a silane coupling agent is applied onto the substrate, and then heat treatment is performed, so that the interface layer can be formed. The interface layer raw-material solution is a solution containing no copper atom such as a copper complex.

(Interface Layer Raw-Material Solution)

The interface layer raw-material solution is prepared by mixing a manganese complex and a silane coupling agent. The manganese complex is used as a raw material for manganese in an interface layer, and the silane coupling agent is used as a raw material for silicon. The concentration ratio of the manganese complex to the silane coupling agent is preferably 0.1 or more and 3.0 or less in terms of molar ratio. The concentration ratio of the same is more preferably 0.3 or more and 1.0 or less.

Manganese complexes that can be used herein are as follows. Examples thereof include manganese (II) acetate, manganese (II) butylate, manganese (II) octoate, manganese (II) hexanoate, manganese (II)ethylhexanoate, manganese (II) acetylacetonate, manganese (II) oleate, manganese (II) carbonyl, cyclopentadienylmanganese tricarbonyl, cyclopentadienylmanganese dicarbonyl, and cyclopentadienyl isocyano cyclohexane manganese dicarbonyl.

Silane coupling agents that can be used herein are as follows. Examples thereof having vinyl functional groups include vinyltrimethoxysilane and vinyltriethoxysilane. Examples thereof having epoxy functional groups include 2-(3,4-epoxycyclohexyl)ethyl trimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane. Examples thereof having styryl functional groups include p-styryltrimethoxysilane. Examples thereof having methacryl functional groups include 3-methacryloxypropyl methyldimethoxysilane, 3-methacryloxypropyltrimethoxysilane, 3-methacryloxypropyl methyldiethoxysilane, and 3-methacryloxypropyltriethoxysilane. Examples thereof having acrylic functional groups include 3-acryloxypropyltrimethoxysilane. Examples thereof having amino functional groups include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and hydrochloride of N-(vinylbenzyl)-2-aminoethyl-3-aminopropyltrimethoxysilane. Examples thereof having ureide functional groups include 3-ureidepropyltriethoxysilane. Examples thereof having mercapto functional groups include 3-mercaptopropyl methyldimethoxysilane, and 3-mercaptopropyl trimethoxysilane. Examples thereof having sulfide functional groups include bis(triethoxysilylpropyl)tetrasulfide. Examples thereof having isocyanate functional groups include 3-isocyanatepropyltriethoxysilane.

Examples of a solvent to be used for the interface layer raw-material solution include, but are not particularly limited to, a hydrocarbon-based solvent, a chlorinated hydrocarbon-based solvent, a cyclic ether-based solvent, an amide-based solvent, a sulfoxide-based solvent, a ketone-based solvent, an alcohol-based compound, an ester-based solvent of polyhydric alcohol, an ether-based solvent of polyhydric alcohol, a terpene-based solvent, and mixtures thereof. Ethyl alcohol is preferred as a solvent.

(Application Method)

As a method for applying a raw-material solution onto a substrate, bar coating, slit coating, spin coating, dip coating methods or the like can be employed. Upon dip coating, a gas such as air or nitrogen is sprayed to remove an excessively adhered solution while pulling the silicon substrate out from a bath with a raw-material solution, in order to have the uniform thickness of the coating film. Moreover, a raw-material solution may be sprayed to the surface of a substrate by the spray coating method. The film thickness can be controlled by controlling the nozzle shape and the spray pressure.

(Heat Treatment)

According to the present invention, after application of an interface layer raw-material solution onto a substrate, heat treatment is performed at a temperature of 400° C. or higher and 600° C. or lower in an atmosphere containing oxygen, so that the interface layer can be formed. With the heating temperature of less than 400° C., organic components remain in the raw-material solution, and this condition tends to lower the adhesion strength of the interface layer. With the heating temperature of higher than 600° C., silicon, that is, a constitutional element of the interface layer, is more easily oxidized than other elements, silicon is dispersed over the surface of the interface layer to be silicon oxide on the surface of the interface layer, and thus the adhesion with copper wiring to be formed thereafter tends to be deteriorated. Accordingly, the heating temperature is preferably 400° C. or higher and 600° C. or lower.

As the atmosphere containing oxygen, an oxidative atmosphere of nitrogen gas, inert gas or the like containing oxygen at a concentration of 100 ppm or more is preferred, or it may be in the air atmosphere. If the total pressure is atmospheric pressure, oxygen concentration of 100 ppm or more corresponds to oxygen partial pressure of 100 Pa or more. When the oxygen concentration is less than 100 ppm, oxidation will not fully proceed. Therefore, carbon from the solution may remain to impair the adhesion of copper wiring even if the heating temperature falls within the above range.

According to the present invention, in an atmosphere containing oxygen, a first heat treatment is performed at a temperature of 150° C. or higher and 225° C. or lower and then a second heat treatment is performed at a temperature of 400° C. or higher and 600° C. or lower, so that the interface layer can be formed.

The first heat treatment involves removing an organic solvent in an interface layer raw-material solution via volatilization, and then drying. When the heating temperature is less than 150° C., high-temperature baking is performed by the subsequent second heat treatment with the organic solvent remaining therein, so that the interface layer contains carbon components after high-temperature baking, which can result in decreased strength of the interface layer. Hence, such temperature of less than 150° C. is not preferred. Moreover, at the time of the first heat treatment, a reaction between a manganese complex and a silane coupling agent is locally initiated within the interface layer. However, at the heating temperature of higher than 225° C., the manganese complex and the silane coupling agent uniformly react with each other throughout the interface layer, which makes it difficult to obtain a required concentration distribution and the structure of the interface layer after high-temperature baking by the second heat treatment, and can cause a decrease in adhesion. Hence, such temperature is not preferred. Accordingly, the temperature for the first heat treatment is preferably 150° C. or higher and 225° C. or lower.

Next, the second heat treatment involves the formation of an oxide from an inorganic component adhered onto the substrate, and the baking of the oxides. At the heating temperature of less than 400° C., oxides are not sufficiently formed, and the adhesion tends to be lowered. At the heating temperature of higher than 600° C., the resulting inorganic material substrate is stable similarly to a substrate, and, silicon within the interface layer is dispersed over the surface of the interface layer so as to form a silicon oxide layer, which can cause decreased adhesion strength with copper wiring to be formed thereafter. Hence, such temperature is not preferred. Accordingly, the temperature for the second heat treatment is preferably 400° C. or higher and 600° C. or lower.

(Copper Paste)

A copper paste is prepared by mixing copper particles, a binder resin, a solvent and the like.

(Copper Particle)

Copper particles contained in a copper paste has an oxygen concentration in particles of 0.05 mass % or more and 2.0 mass % or less. More preferably, the upper limit of the concentration is preferably 1.0 mass % or less. The oxygen concentration of more than 2.0 mass % leads to a significant degree of oxidation of metal particles, the particles are more likely to aggregate in the copper paste, and the printability tends to be deteriorated. Furthermore, metal oxides are not sufficiently reduced even via the subsequent baking, and thus wiring resistance after baking tends to increase. Meanwhile, the oxygen concentration is desired to be as low as possible. However, a treatment in a reducing gas is required to have an oxygen concentration of less than 0.05 mass % in metal particles prepared by the atomization method or the like, resulting in a high cost. Thus, such a concentration is not preferred.

The total concentration of metal elements other than copper contained in particles is suppressed to 1.0 mass % or less, and more preferably to 0.8 mass % or less.

Copper particles are preferably manufactured by a gas atomization method, or a water atomization method, for example. The average value of aspect ratios (dmax/dmin) as defined by the ratio of the maximum diameter (dmax) to the minimum diameter (dmin) of particles may be 1.0 or more and 2.2 or less, and is preferably 1.0 or more and 2.0 or less. The average aspect ratio of copper particles of higher than 2.2 results in flat flake-shaped or needle shaped particles, so that clogging tends to take place upon screen printing. Moreover, the rate of filling with copper particles in printed wiring decreases to induce the drained shape of the wiring, to increase the percentage of voids, and to lower the degree of baking, thereby often causing increased wiring resistance after baking.

(Binder Resin)

The mass % of a binder resin in an organic vehicle contained in a conductive paste is preferably higher than 0.05% and 17.0% or less. The binder resin may be any resin as long as it is decomposed by baking. Examples thereof include cellulosic resins such as methylcellulose, ethylcellulose, and carboxymethylcellulose, an acrylic resin, a butyral resin, an alkyd resin, an epoxy resin, and a phenol resin. Of these, a cellulose type resin is preferably used, since it is likely to react with trace oxygen or trace carbon monoxide contained in a baking atmosphere, so as to easily disappear from the paste. Further preferably, among cellulose type resins, ethylcellulose is preferably used.

(Solvent)

A solvent to be contained in a conductive paste is not particularly limited, as long as it has an adequate boiling point, vapor pressure, and viscosity. Examples thereof include a hydrocarbon-based solvent, a chlorinated hydrocarbon-based solvent, a cyclic ether-based solvent, an amide-based solvent, a sulfoxide-based solvent, a ketone-based solvent, an alcohol-based compound, an ester-based solvent of polyhydric alcohol, an ether-based solvent of polyhydric alcohol, a terpene-based solvent, and mixtures thereof. Of these, the use of texanol, butyl carbitol, butyl carbitol acetate, and terpineol, each having a boiling point of near 200° C., is preferred.

(Formation of Electrode)

According to the present invention, a copper electrode can be formed on an interface layer by printing the above copper paste on a substrate provided with the interface layer by a screen printing method or the like, drying the substrate, performing oxidative baking in an atmosphere containing oxygen, and then performing reduction in an atmosphere containing alcohol or hydrogen. Oxidation and reduction of the copper paste causes the copper paste to react with the interface layer, and a concentration distribution and a structure are achieved and formed as desired, contributing to improvement in adhesion. In the present invention, the interface layer raw-material solution contains no copper atom such as a copper complex, and thus the interface layer before application of the copper paste contains no copper. Accordingly, the present inventors assume that a copper atom in the copper paste rapidly enter and aggregate within the interface layer due to heating at the time of the formation of the copper electrode, so that copper crystal grains are formed within the interface layer.

After printing with the copper paste, first, the resultant is preferably heated and dried in an inert gas atmosphere at a temperature of 150° C.-250° C. A highly volatile solvent is removed by this heating. A nitrogen gas, an argon gas or the like can be used as an inert gas.

Subsequently, baking is preferably performed as a first-step heat treatment in an oxidizing atmosphere containing oxygen at a temperature of 350° C.-600° C. for 1 minute to 15 minutes. The resin component is removed by this heating and copper particles are converted to copper oxide. An oxidizing atmosphere wherein the oxygen concentration is 500 ppm or more in terms of volume ratio is preferred. Heating at less than 350° C. or less than 1 minute of heating is not preferred, since this can cause insufficient disappearance of resins and the resins to remain in electrode wiring. Heating at a temperature of higher than 600° C. or more than 15 minutes of heating can cause excessive oxidation to proceed, can increase the proportion of a needle-shaped cupric oxide generated, and can inhibit the generation of a fine sintered body. Hence, such heating is not preferred.

Subsequently, baking is preferably performed as a second-step heat treatment in a reducing atmosphere containing carbon monoxide, alcohol, or hydrogen at a temperature of 350° C.-600° C. for 1 minute to 15 minutes. Copper oxide particles are reduced to copper particles by this heating, so that baking of copper particles is performed. Heating at less than 350° C. or less than 1 minute of heating can cause insufficient reduction of copper oxide to increase electric resistivity. Hence, such heating is not preferred. Heating at a temperature of higher than 600° C. or more than 15 minutes of heating can cause a reaction to take place among the copper electrode and the interface layer and the substrate, so as to increase electric resistivity. Hence, such heating is not preferred. Moreover, a preferred atmosphere contains carbon monoxide, alcohol, or hydrogen in an amount accounting for 1 to 15% in terms of volume percentage.

An electronic component can be manufactured by soldering electronically implemented products such as a semiconductor transistor, a resistor, and a capacitor onto the copper electrode of the thus obtained substrate for electronic components.

EXAMPLES

The present invention is further described in detail based on examples, but the present invention is not limited by the explanation.

Example 1

A commercially available hard glass substrate (20 mm×20 mm in length and 0.6 mm in thickness) was used. The surface of the substrate was degreased with acetone and alcohol. A raw-material solution for an interface layer was prepared by mixing each of manganese (II) acetate tetrahydrate as a manganese complex and 3-aminopropyltriethoxysilane as a silane coupling agent with ethyl alcohol. The total amount of the manganese complex and the silane coupling agent accounted for 90% with respect to ethyl alcohol in terms of volume percentage. The raw-material solution was applied onto the glass substrate by the spin coating method. Application was performed by varying the molar concentration ratio (Mn/Si) of the manganese complex to the silane coupling agent within the range of 0.1 or more to 3.0 or less.

Next, the above-applied glass substrate was placed within a baking furnace, dried in air at 180° C. for 10 minutes, thereby removing organic components mainly composed of ethyl alcohol in the raw-material solution. Subsequently, the glass substrate was baked in air at 450° C. for 10 minutes, thereby forming an interface layer with a thickness of 12 nm containing manganese and silicon on the glass substrate.

Thereafter, a copper paste containing no glass frit was applied to the center of the substrate on the interface layer by the screen printing method, so as to form a plurality of square electrodes each with a 2-mm side and a thickness of about 20 μm. The substrate was placed within the baking furnace, heated for oxidation in a nitrogen gas containing 1000-ppm oxygen at 400° C. for 10 minutes, and then heated for reduction in a nitrogen gas containing 5% hydrogen at 550° C. for 10 minutes, thereby forming copper electrodes on the substrate and obtaining the test substrate.

The copper paste used as described above was prepared by mixing an organic vehicle comprising 5 mass % of ethylcellulose and 95 mass % of texanol with 88 mass % of copper particles, so that the content of the organic vehicle was 12 mass %. The copper particles had a 10% diameter of 0.7 μm, a 50% diameter of 1.3 μm, a 90% diameter of 2.2 μm, and the average aspect ratio of 1.2.

(Adhesion Strength)

A test for evaluating the adhesion of test substrates is explained.

Adhesion strength was evaluated in accordance with JIS standard C60068-2-21. A solder cream was applied to the surface of copper electrodes on a test substrate, a copper jig was attached thereonto, and then the substrate was heated to bond the jig and the copper electrodes by soldering, thereby preparing a test body. A portion of the glass substrate of the test body was fixed to a tensile tester. A tensile load was applied to the jig attached to the copper electrodes. The area of copper electrodes to which a tensile load had been applied was 4 mm2 (=2 mm×2 mm). Tensile load (unit N (newton)) was measured when the jig was peeled off from the test substrate, and then designated as adhesion strength per 4 mm2. Adhesion of 10N or more was determined to be good (approval), and adhesion of less than 10N was determined to be bad (rejection). The test results are shown in Table 1.

TABLE 1

| Mn/Si | 0.1 | 0.3 | 0.5 | 0.8 | 1.0 | 1.4 | 1.7 | 2.1 | 2.5 | 3.0 |
|---|---|---|---|---|---|---|---|---|---|---|
| Adhesion strength (N) | 7 | 12 | 20 | 21 | 25 | 22 | 15 | 9 | 7 | 7 |

As shown in Table 1, adhesion strength was 10N or more when the molar concentration ratio (Mn/Si) of the manganese complex to the silane coupling agent was 0.3 or more and 1.7 or less. The molar concentration ratio of less than 0.3 is considered to result in a tendency such that a spinel structure intermediate phase of a copper manganese oxide and a manganese silicon oxide required to strengthen the interface layer is not easily formed, because of a low manganese concentration in the interface layer. Furthermore, the molar concentration ratio of higher than 1.7 is considered to result in a tendency such that an oxide mainly composed of silicon, which is required to improve the adhesion with an inorganic material substrate, is not easily formed, because of a low silicon concentration in the interface layer.

Example 2

Test substrates were prepared by procedures similar to those in Example 1, except that the molar concentration ratio of a manganese complex to a silane coupling agent was 0.5 and the thickness of the interface layer was varied within a range of 2-300 nm. Adhesion strength per 4 mm2 was determined. Interface layers with various thicknesses were applied by varying the amount of a raw material to be added dropwise, rotational frequency, and the number of application at the time of spin coating. Test results are shown in Table 2.

TABLE 2

| Thickness (nm) | 2 | 3 | 5 | 30 | 80 | 125 | 150 | 200 | 260 | 300 |
|---|---|---|---|---|---|---|---|---|---|---|
| Adhesion strength (N) | 6 | 8 | 17 | 23 | 22 | 17 | 14 | 9 | 6 | 7 |

As shown in Table 2, interface layers with thicknesses of 5 nm or more and 150 nm or less were found to have adhesion strength of 10N or more and exerted excellent adhesion. With the thickness of less than 5 nm, adhesion was likely to decrease. Moreover, with the thickness of higher than 150 nm, adhesion strength was likely to decrease, however, this may be due to the formation of a layer having relatively low strength within the interface layer.

Example 3

Test substrates were prepared by the procedures similar to those in Example 1, except that the molar concentration ratio (Mn/Si) of a manganese complex to a silane coupling agent was 0.5 and the drying temperature was varied within a range of 100° C.-250° C. Adhesion strength per 4 mm2 was determined. Test results are shown in Table 3.

TABLE 3

| Drying temperature (° C.) | 100 | 125 | 150 | 175 | 200 | 225 | 250 |
|---|---|---|---|---|---|---|---|
| Adhesion strength (N) | 6 | 8 | 14 | 25 | 24 | 17 | 9 |

As shown in Table 3, when the drying temperature of interface layers was 150° C. or higher and 225° C. or lower, adhesion strength was 10N or more and excellent adhesion was exerted. The drying temperature of less than 150° C. resulted in a tendency such that the strength of the interface layers was lowered because of insufficient removal of organic solvents and the resulting containment of carbon components in the interface layers after high-temperature baking. The drying temperature of higher than 225° C. resulted in a tendency of lowered adhesion strength. This may be because a uniform reaction between the manganese complex and the silane coupling agent was facilitated throughout the interface layer, and thus the concentration distribution and the structure contributing to the adhesion of the interface layer after high-temperature baking were not obtained.

Example 4

Test substrates were prepared by the procedures similar to those in Example 1, except that the molar concentration ratio (Mn/Si) of a manganese complex to a silane coupling agent was 0.5 and the baking temperature was varied within a range of 350° C.-650° C. Adhesion strength per 4 mm2 was determined. Test results are shown in Table 4.

TABLE 4

| Baking temperature (° C.) | 350 | 400 | 450 | 500 | 550 | 600 | 650 |
|---|---|---|---|---|---|---|---|
| Adhesion strength (N) | 8 | 11 | 24 | 22 | 16 | 12 | 7 |

As shown in Table 4, when the temperature for baking an interface layer was 400° C. or higher and 600° C. or lower, adhesion strength was 10N or more and excellent adhesion was exerted. The baking temperature of lower than 400° C. resulted in a tendency of decreased adhesion because of insufficient formation of oxides. The baking temperature of higher than 600° C. resulted in a tendency of decreased adhesion strength. This may be due to decreased adhesion with copper wiring, since the interface layer was stabilized similarly to a substrate due to high-temperature baking, and, a silicon oxide layer was formed on the surface of the interface layer.

Samples found to have adhesion strength of 10N or more in Examples 1 to 4 were subjected to observation of cross-sectional structures of interface layers obtained under the following manufacturing conditions (1) to (4) by high-angle annular dark-field scanning transmission electron microscopy (STEM-HAADF). The thus observed images are shown in FIG. 1 (1) to (4). A scale bar shown in FIG. 1(1) is the same as those in FIG. 1(2) to (4).

(Manufacturing Conditions)
(1) Mn/Si=0.5 in Table 1 of Example 1.
(2) Thickness=30 nm in Table 2 of Example 2.
(3) Drying temperature=150° C. in Table 3 of Example 3.
(4) Baking temperature=450° C. in Table 4 of Example 4.

FIG. 1 shows that a bright portion is composed of atoms with high atomic weights and a dark portion is composed of atoms with low atomic weights. Specifically, such a bright portion is Cu, and the dark portion is an oxide or a nitride.

As shown in FIG. 1(1)-(4), samples having adhesion strength of 10N or more in Examples 1 to 4 were confirmed that copper crystal grains were dispersed in the interface layers.

Example 5

A glass substrate on which an interface layer had been formed was prepared by procedures similar to those in Example 1 except that the molar concentration ratio (Mn/Si) of a manganese complex to a silane coupling agent was 0.5. Subsequently, a copper paste containing no glass frit, similar to that in Example 1, was applied by the screen printing. Next, oxidation was performed by heating in a nitrogen atmosphere containing 0.1% oxygen at 450° C. for 10 minutes, reduction was performed in a nitrogen atmosphere containing 5% hydrogen at 550° C. for 10 minutes, electrodes were formed, and thus test substrates were obtained. When a tensile test was conducted by procedures similar to those in Example 1, adhesion strength per 4 mm2 was 23N. Thin section samples were prepared using a focused ion beam (FIB) instrument, and then the structures were observed under a transmission electron microscope. Composition analysis was performed using an energy dispersive X-ray spectrometer.

Figure 2:
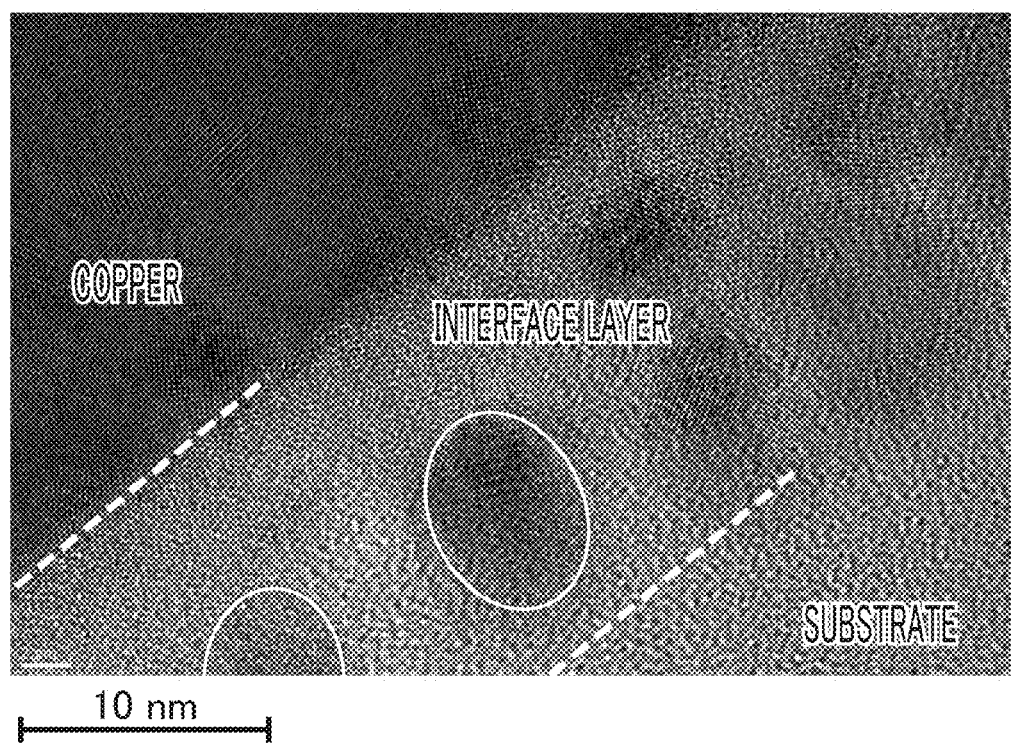
FIG. 2 shows the structure near the interface layer of Example 5 of the present invention, as observed under a scanning electron microscope.

Cross-sectional structures composed of copper electrode/interface layer/glass substrate were observed under a transmission electron microscope. The microscope used for observation was a JEM-ARM200F transmission electron microscope (JEOL Ltd.). FIG. 2 shows an image of the structure. The boundary between copper electrodes and an interface layer and the same between the interface layer and a glass substrate are shown with dotted lines. In FIG. 2, dark regions in contrast to the others exerting periodic check patterns within the interface layer are crystal grains. Two crystal grains thereof are shown enclosed with solid lines as typical examples.

As shown in FIG. 2, crystal grains having a crystal structure were present and distributed in the interface layer. To find the existing density of the crystal grains: photographs were taken, including a 100-nm interface layer in the longitudinal direction; and a region on the copper electrode side and a region on the glass substrate side, which were bordered by the central portion of the thickness of the interface layer, were separately observed. An area percentage occupied by crystal grains with respect to the area of each region in the 100-nm interface layer in the longitudinal direction was calculated. As a result, the existing density of crystal grains was higher on the glass substrate side than on the copper electrode side, such that the former density was about 5.2 times the latter density. Similar analyses were conducted for 5 interface regions. As a result, the existing density of crystal grains on the glass substrate side was 1.2 or more times and 7.8 or less times that on the copper electrode side.

Figure 3:
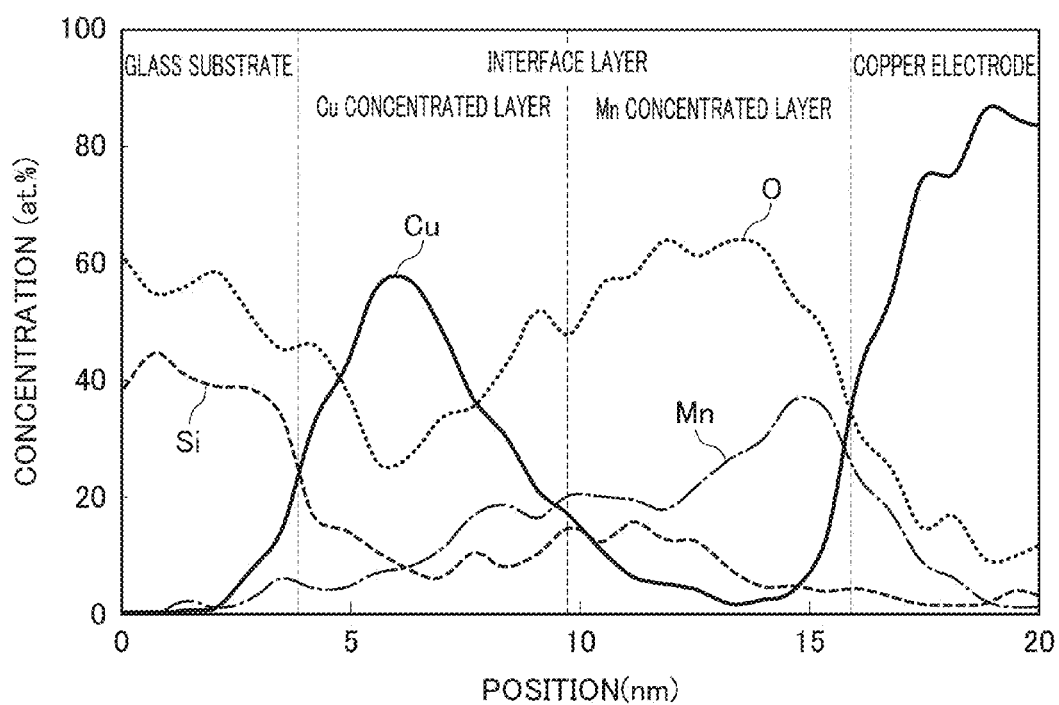
FIG. 3 shows the analytical results of the composition near the interface layer of Example 5 of the present invention.

A transmission electron microscope of the same type as described above was used to analyze the concentration distribution of elements in the vicinity of the interface layers. In addition, the transmission electron microscope was equipped with a JED-2300T energy dispersive X-ray analyzer (JEOL), and the concentrations of constitutive elements were measured using standard analytical software associated therewith. All of these are standard devices. The diameter of an electron beam used for analysis was 2 nm, representative regions in the vicinity of an interface layer were scanned with an electron beam along a straight line from a copper electrode portion to a glass substrate, thereby determining the concentration distribution of copper (Cu), manganese (Mn), silicon (Si), and oxygen (O). FIG. 3 shows measurement results. Curves in FIG. 3 indicate the percentage of each element existing at measured positions with atom % (at %). In FIG. 3, a portion sandwiched between: the boundary on the copper side (boundary between copper electrodes and an interface layer) wherein the concentration distribution of Cu crosses that of O on the copper electrode side; and the boundary on the substrate side (boundary between a glass substrate and the interface layer) where the concentration distribution of Si crosses that of Cu on the glass substrate side corresponds to the interface layer. The average concentrations of constitutional elements in the first region on the copper electrode side from the central part, and the second region on the glass substrate side were found by dividing the total sum of concentration distribution curves obtained by linear analysis in FIG. 3 by the length of each region. In the first region (referred to as "Mn concentrated layer"), the average Mn concentration was 2.8 times higher than the average Cu concentration, and 2.7 times higher than the average Si concentration. In the second region (referred to as "Cu concentrated layer"), the average Cu concentration was 3.1 times higher than the average Mn concentration, and 3.7 times higher than the average Si concentration.

Similar composition analysis was conducted for other 5 interface regions. As a result, in the first region, the average Mn concentration was 1.3 or more and 4.7 or less times the average Cu concentration. In the second region, the average Cu concentration was 1.4 or more and 10.2 or less times the average Mn concentration. Moreover, in the same second region, the average Cu concentration was 1.2 or more and 9.3 or less times the average Si concentration.

It could be confirmed from the analytical results in FIG. 3 that the interface layer contained oxygen, an oxide mainly composed of Mn was present in the Mn-concentrated layer on the copper electrode side of the interface layer, and an oxide mainly composed of Mn and Si was present in the Cu-concentrated layer on the substrate side of the interface layer.

Figure 4:
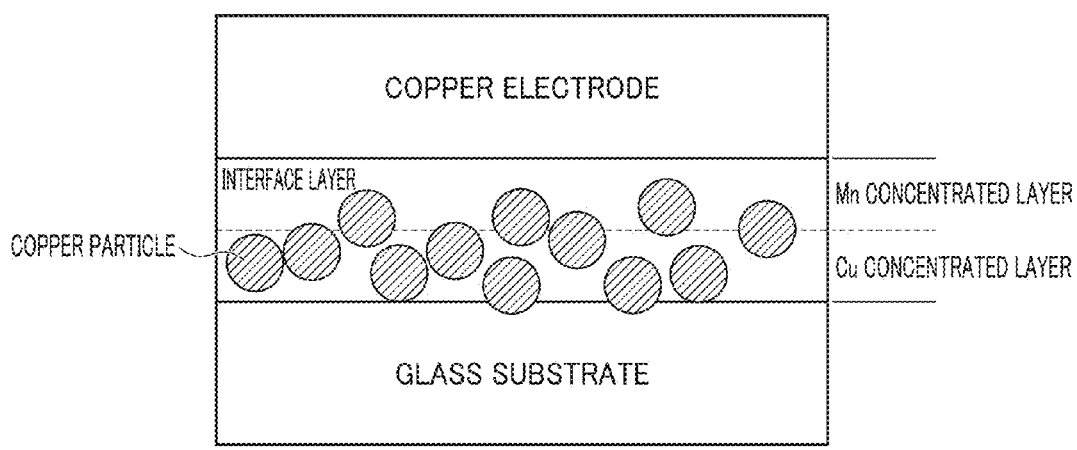
FIG. 4 is a schematic diagram of the cross-sectional structure of the interface layer of Example 5 of the present invention.

In addition, many crystal grains were present on the substrate side of the interface layer. The concentration of a copper element shown in FIG. 3 was higher in the second region on the substrate side than the first region. It could be confirmed from the analytical results of the diffraction pattern obtained by fast Fourier transform of high-resolution lattice image, in addition to the analytical results of the composition distribution, that the crystal grains were particles having a face-centered cubic structure mainly composed of copper. FIG. 4 schematically shows the structure of the interface layer obtained from these measurement results.

Comparative Example

Samples having adhesion strength per 4 mm2 of less than 10N were prepared by procedures similar to those in Example 5 except that the baking temperature for the interface layer was 650° C. for comparison. Structural observation and composition analysis were conducted using the samples by procedures similar to those in Example 5. However, the formation of crystal grains was not observed in the interface layers. Moreover, concentration distributions of Mn and Si in the interface layers were almost the same. It was considered from the result that according to the present invention, the presence of crystal grains and the formation of a composition distribution wherein Mn and Si were unevenly distributed in the interface layer between copper electrodes and a substrate, resulted in exertion of high adhesion strength and good adhesion.

Example 6

Test substrates were prepared by procedures similar to those in Example 1, except that the molar concentration ratio (Mn/Si) of a manganese complex to a silane coupling agent was 0.5, and alumina (Al2O3), quartz (SiO2), silicon carbide (SiC), aluminium nitride (AlN), and silicon nitride (Si3N4) substrates were used instead of glass substrates. Adhesion was then evaluated. The substrates were found to have adhesion strength per 4 cm2 of 28N, 26N, 17N, 14N, and 15N (error: ±2.4 N), respectively. All substrates exerted adhesion strength of 10N or more.

The invention claimed is:

1. An electric component comprising a copper electrode on an inorganic material substrate, wherein an interface layer containing copper, manganese, silicon and oxygen is provided at the interface between the substrate and the copper electrode, and the interface layer contains crystal grains mainly composed of copper and dispersed therein, wherein the interface layer comprises a first region and a second region.

2. The electronic component according to claim 1, wherein said interface layer has an average concentration of at least manganese higher than that of copper in a first region on said copper electrode side from the center of the thickness of said interface layer.

3. The electronic component according to claim 1, wherein said interface layer has an average concentration of copper higher than that of manganese and that of silicon in a second region on said substrate side from the center of the thickness of said interface layer.

4. The electronic component according to claim 1, wherein said first region comprises an oxide mainly composed of manganese, and said second region comprises an oxide mainly composed of manganese and silicon.

5. The electronic component according to claim 1, wherein said second region contains more crystal grains than those contained in said first region.

6. The electronic component according to claim 1, wherein said interface layer has a thickness of 5 nm or more and 150 nm or less.

7. The electronic component according to claim 1, wherein said copper electrode contains no lead glass component.

8. A method for manufacturing an electronic component comprising a copper electrode on an inorganic material substrate, comprising an interface layer formation step for forming an interface layer on said substrate, and an electrode formation step for forming said copper electrode on said interface layer, wherein said interface layer contains copper, manganese, silicon and oxygen, and contains crystal grains mainly composed of copper and dispersed therein.

9. The method for manufacturing an electronic component according to claim 8, wherein said interface layer formation step comprises applying an interface layer raw-material solution (excluding an interface layer raw-material solution containing a copper complex) containing a manganese complex and a silane coupling agent onto said substrate, and then performing heat treatment to form said interface layer.

10. The method for manufacturing an electronic component according to claim 9, wherein a molar concentration ratio Mn/Si of said manganese complex to said silane coupling agent is 0.3 or more and 1.7 or less.

11. The method for manufacturing an electronic component according to claim 8, wherein said interface layer formation step comprises applying an interface layer raw-material solution onto said substrate, and then performing heat treatment in an atmosphere containing oxygen at a temperature of 400° C. or higher and 600° C. or lower to form said interface layer.

12. The method for manufacturing an electronic component according to claim 8, wherein said interface layer formation step comprises applying an interface layer raw-material solution onto said substrate, performing, in an atmosphere containing oxygen, a first heat treatment at a temperature of 150° C. or higher and 225° C. or lower and then a second heat treatment at a temperature of 400° C. or higher and 600° C. or lower to form said interface layer.

13. The method for manufacturing an electronic component according to claim 8, wherein said electrode formation step comprises forming said copper electrode using a copper paste that contains no glass frit.

14. The method for manufacturing an electronic component according to claim 8, wherein said electrode formation step comprises a step of applying a copper paste onto said interface layer, and then, a step of drying in an inert gas atmosphere, and then, a step of oxidative baking in an atmosphere containing oxygen, and then, a step of reducing in an atmosphere containing carbon monoxide, alcohol or hydrogen to form said copper electrode.

15. The method for manufacturing an electronic component according to claim 14, wherein the temperature in said step of drying in an inert gas atmosphere is 150° C. or higher and 250° C. or lower.

16. The method for manufacturing an electronic component according to claim 14, wherein the temperature in said step of oxidative baking in an atmosphere containing oxygen is 350° C. or higher and 600° C. or lower.

17. The method for manufacturing an electronic component according to claim 14, wherein the temperature in said step of reducing in an atmosphere containing carbon monoxide, alcohol or hydrogen is 350° C. or higher and 600° C. or lower.

* * * * *